(12) United States Patent
MacDonald

(10) Patent No.: US 7,390,748 B2
(45) Date of Patent: Jun. 24, 2008

(54) METHOD OF FORMING A POLISHING INHIBITING LAYER USING A SLURRY HAVING AN ADDITIVE

(75) Inventor: Michael J. MacDonald, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 236 days.

(21) Appl. No.: 10/710,827

(22) Filed: Aug. 5, 2004

(65) Prior Publication Data

US 2006/0030154 A1 Feb. 9, 2006

(51) Int. Cl.
*H01L 21/461* (2006.01)
*H01L 21/302* (2006.01)

(52) U.S. Cl. .................. 438/692; 438/693; 438/695; 438/705

(58) Field of Classification Search .................. None
See application file for complete search history.

(56) References Cited

U.S. PATENT DOCUMENTS

| | | | |
|---|---|---|---|
| 6,358,832 B1 * | 3/2002 | Edelstein et al. ............ 438/612 |
| 6,514,862 B2 | 2/2003 | Lee et al. | |
| 6,530,968 B2 * | 3/2003 | Tsuchiya et al. ............. 51/307 |
| 6,936,543 B2 * | 8/2005 | Schroeder et al. ........... 438/692 |
| 2002/0023389 A1 * | 2/2002 | Minamihaba et al. ......... 51/308 |

OTHER PUBLICATIONS

Parks, George A., "The Isoelectric Points of Solid Oxides, Solid Hydroxides, and Aqueous Hydroxo Complex Systems," Chemical Reviews, 1965, pp. 177-198.

* cited by examiner

*Primary Examiner*—Zandra Smith
*Assistant Examiner*—Khanh B Duong
(74) *Attorney, Agent, or Firm*—Joseph Petrokaitis; Hoffman, Warnick & D'Alessandro LLC

(57) ABSTRACT

A polishing inhibiting layer forming additive for a slurry, the slurry so formed, and a method of chemical mechanical polishing are disclosed. The polishing inhibiting layer is formed through application of the slurry to the surface being polished and is removable at a critical polishing pressure. The polishing inhibiting layer allows recessed or low pattern density locations to be protected until a critical polishing pressure is exceeded based on geometric and planarity considerations, rather than slurry or polishing pad considerations. With the additive, polishing rate is non-linear relative to polishing pressure in a recessed/less pattern dense location. In one embodiment, the additive has a chemical structure: $[CH_3(CH_2)_xN(R)]M$, wherein M is selected from the group consisting of: Cl, Br and I, x equals an integer between 2 and 24, and the R includes three carbon-based functional groups, each having less than eight carbon atoms.

14 Claims, 10 Drawing Sheets

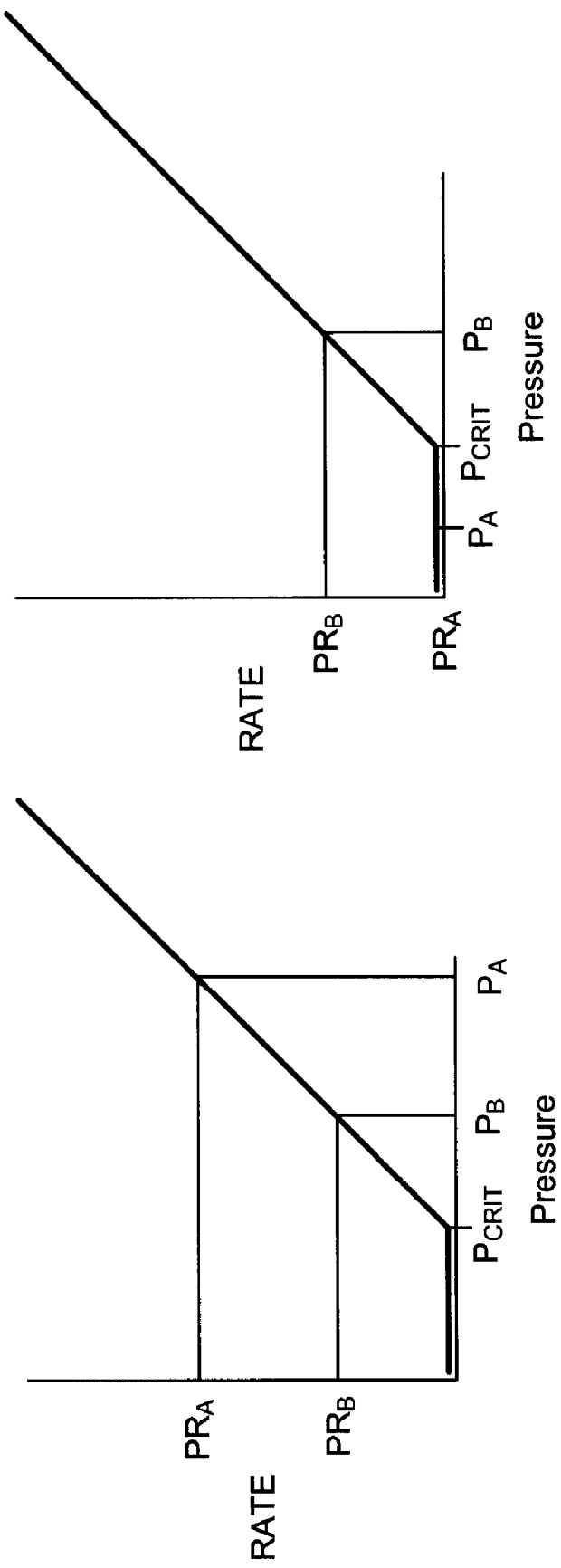

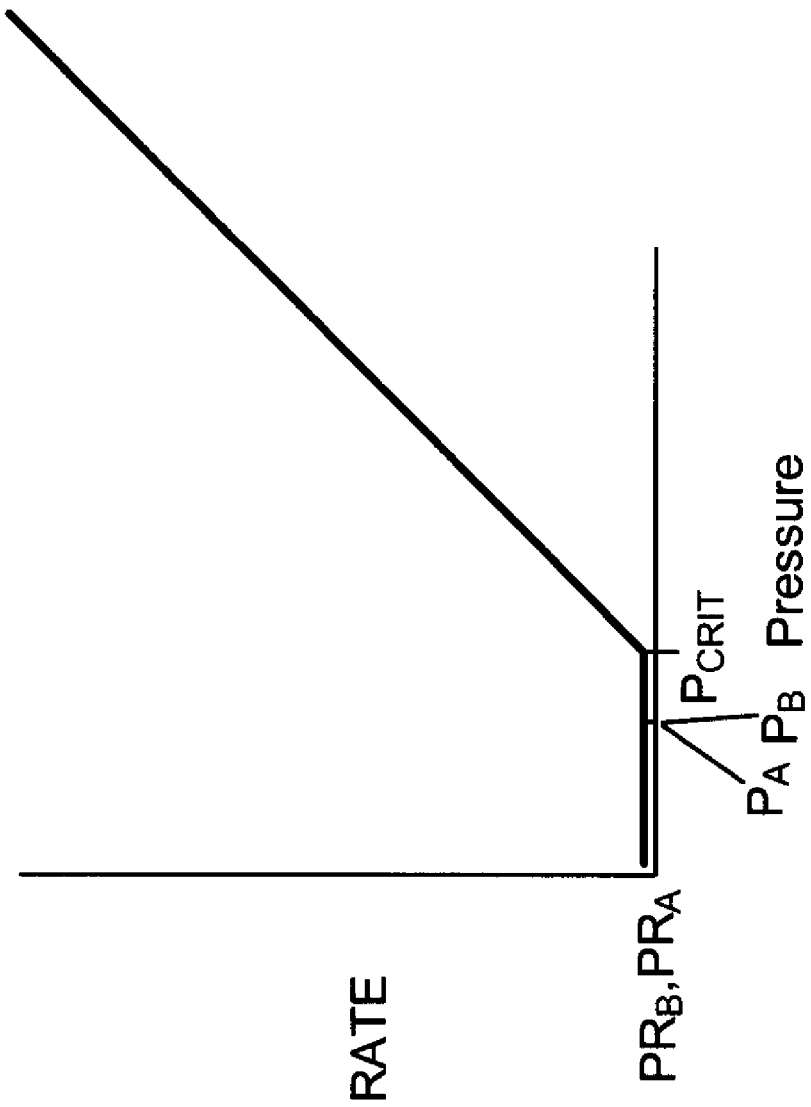

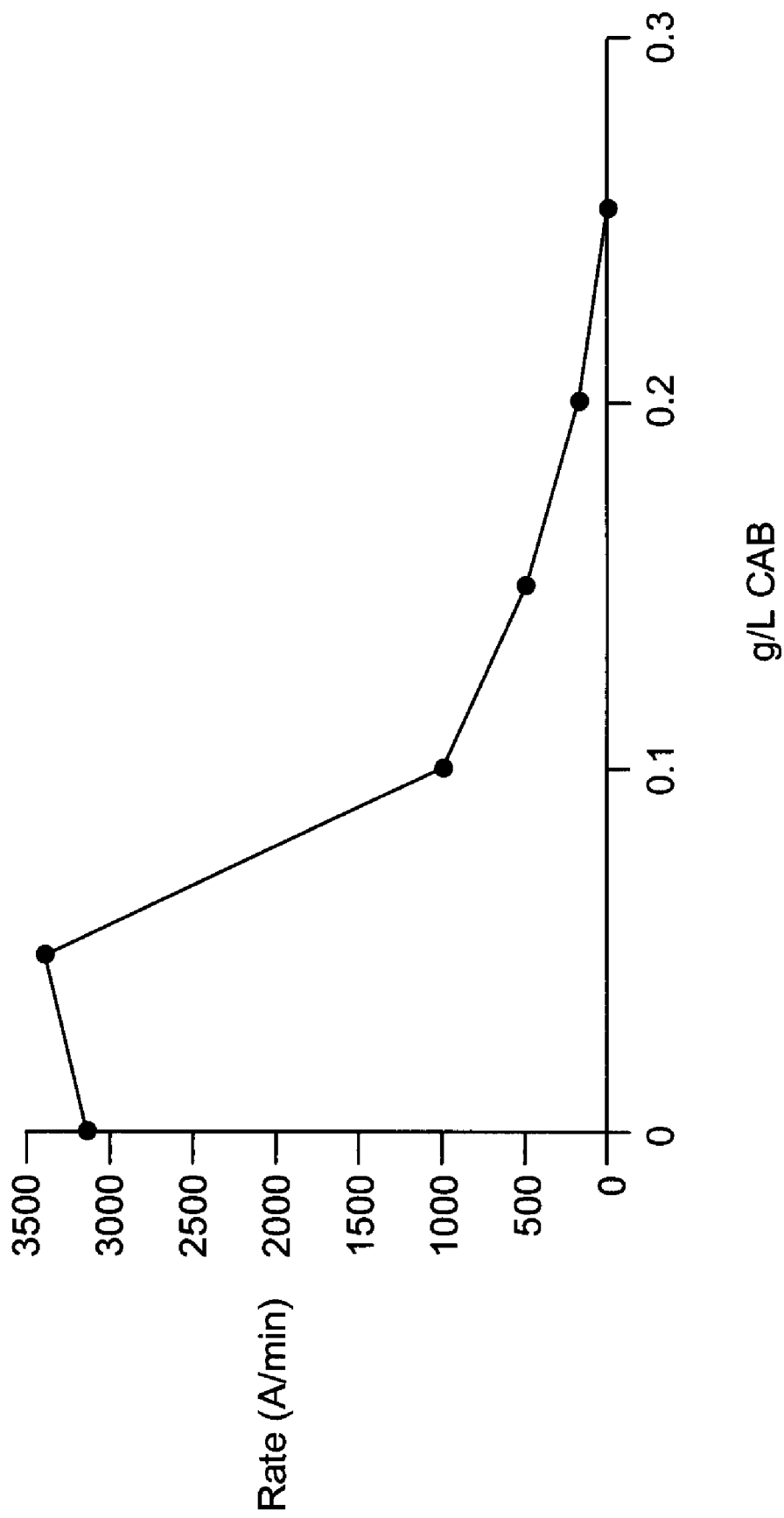

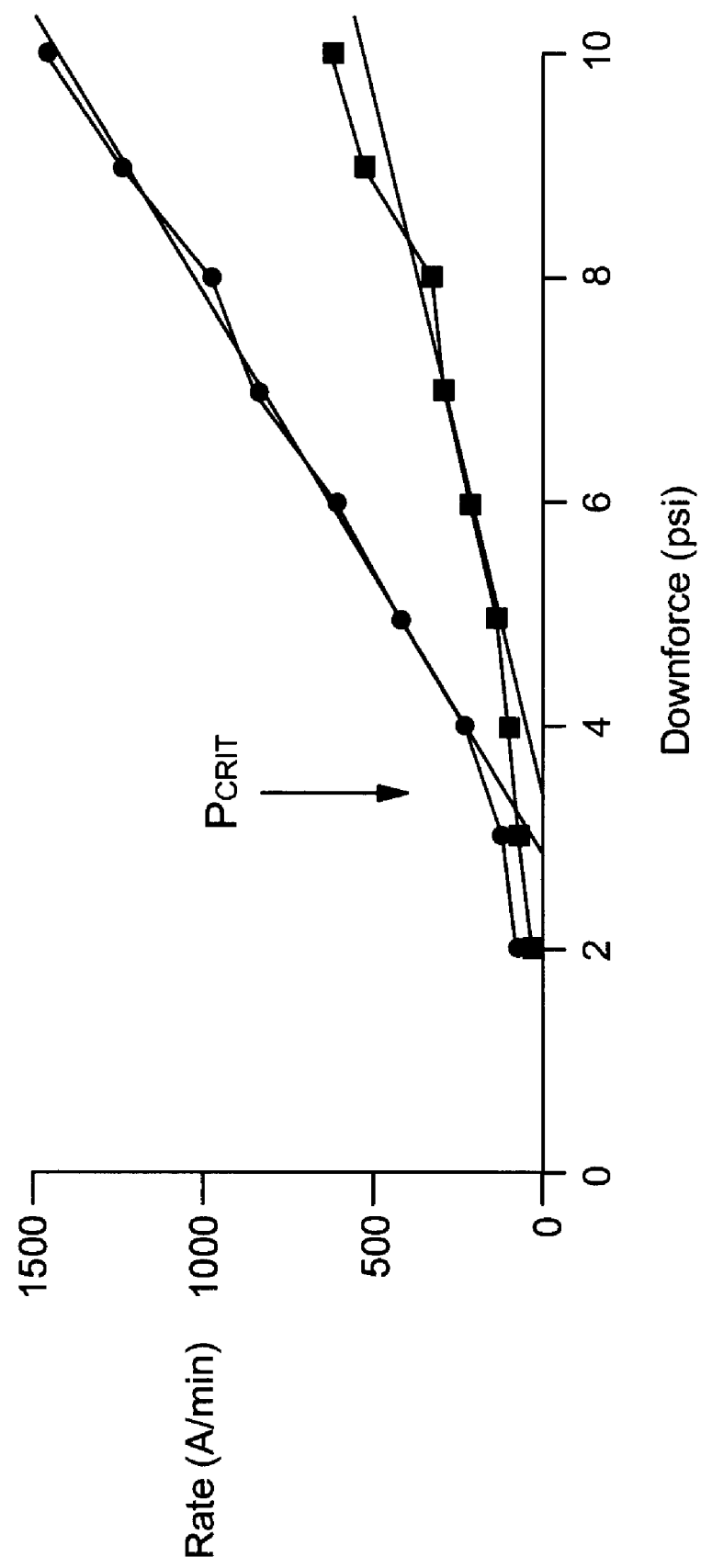

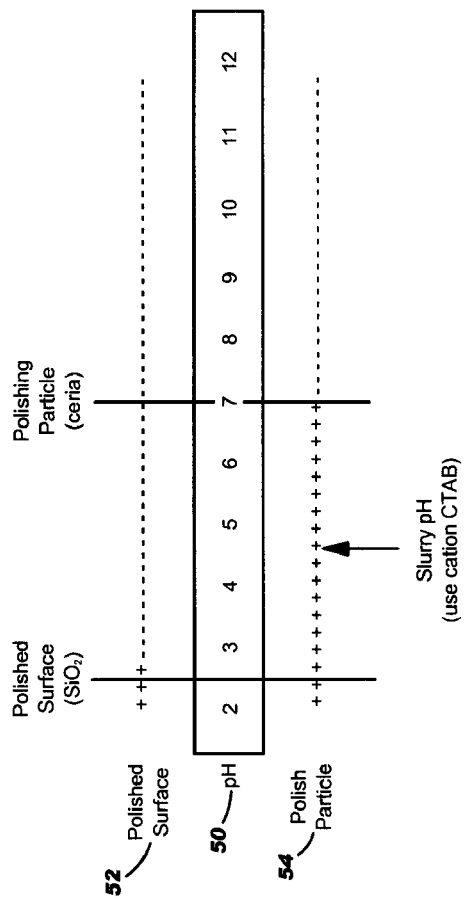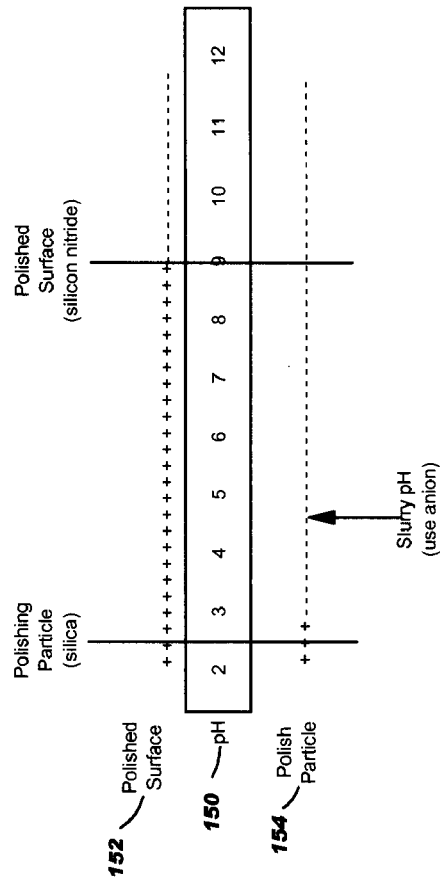

METHOD OF FORMING A POLISHING INHIBITING LAYER USING A SLURRY HAVING AN ADDITIVE

BACKGROUND OF INVENTION

The present invention relates generally to semiconductor wafer polishing, and more particularly, to a polishing inhibiting layer forming additive for a slurry, the slurry so formed, and a method of chemical mechanical polishing.

In the semiconductor industry, chemical mechanical polishing (CMP) is used to smooth, planarize, and/or remove layers during the fabrication process. During CMP, a slurry is dispersed over the surface to be polished as a polishing pad rotates in contact with the surface to smooth, planarize and/or remove the surface. One problem with conventional CMP processes and slurries is that they do not perfectly planarize a surface, especially those that have a variety of pattern densities or have an uneven topography. For example, FIG. 1 shows an illustrative surface topography of a semiconductor wafer 8 including a raised location A that is higher than a recessed location B. Typically, a polishing rate of a surface is considered equivalent to a slurry's coefficient of friction (k) times polishing pressure (sometimes referred to as downforce) (P), i.e., polishing rate (PR)=k*P. That is, polishing rate is linear with polishing pressure P. The local polishing pressure, however, is proportional to the localized planarity and pattern density of the location. In the FIG. 1 topography, polishing pressure for location A is greater than the polishing pressure for location B, and planarity is ideally achieved by the rate differential for the locations A, B. In this case, recessed location B is preferably not polished until raised location A is planar therewith. In the topography illustrated in FIG. 1, however, a number of factors result in a non-zero polishing rate in recessed location B even though polishing pad 10 never contacts the surface. One factor that causes this problem is slurry above recessed location B still provides a modicum of polishing, which may destroy recessed location B. Another factor is the flexibility of a polishing pad 10, which causes recessed location B to be polished even though not desired.

Another factor is the geometric lengthscales of the features to be polished as compared to the "planarization length" (Lp) of the process. "Planarization length" can be thought of as the lengthscale of the pad that can bend and conform. If a pad is very rigid, it is flat and will tend to flatten things over a very long distance relative to a chip wire dimension (microns). If the polishing pad is very flexible this length is much shorter and the pad can bend and conform to items that are closer together. Accordingly, if, for example, two large, dense supporting features (e.g., points A in FIG. 1) are provided on a wafer at a distance (L) apart and one or more less dense random structures (e.g., structure B in FIG. 1) fill the space(s) between them, it is advantageous to know at what lengthscale L those inner structures will be protected by the large structures. That length of protection varies with the pad to the first order (slurry and other things to $2^{nd}$ order) and is called the "planarization length." When Lp>L, those features would be protected from detrimental polishing.

Referring to FIGS. 2A-2H, the above-described problems are further illustrated relative to a wafer 18 (FIG. 2A only) including a location A having a somewhat less dense pattern formation than a location B. As illustrated, through time=0-2 (FIGS. 2A-2C), polishing progresses non-uniformly due to the pattern density differences between location A and location B. In particular, as shown in FIG. 2G, due to the different densities, localized pressure at location A ($P_A$) and B ($P_B$) are different, which results in different polishing rates (PR), i.e., $P_A>P_B$, $PR_A>PR_B$. As polishing progresses through time=2, 3 and 4 (FIGS. 2C-2E), the disparity between polishing rates of location A and B, results in a much faster removal of material for location A. As shown in FIG. 2D, eventually, the low-density location A is planarized such that location A becomes 100% filled. At this point, the polishing pressure becomes uniform and equal to the total applied pressure. However, the pressure at higher points, e.g., location B, remains high. As shown in FIG. 2H, this results in $P_A<P_B$, $PR_A<PR_B$. Note, however, that $PR_A$ is non-zero. The result of this polishing is shown in FIG. 2E, in which location A is rutted and nonplanar with location B. In contrast, FIG. 2F illustrates the intended result in which location A and B are planar, i.e., $P_A=P_B$, and $PR_A=PR_B$. This structure is obtained through conventional polishing only after long time periods of polishing, where the planarity is achieved at the expense of thinning the thickness of the total film stack.

Surfactants have been added to slurries to improve removal selectivity. For example, U.S. Pat. No. 6,514,862 to Lee et al., discloses a wafer polishing slurry and CMP method in which a surfactant is added. In this case, however, the surfactant is meant to form a non-removable layer, which does not address the above-described problems.

In view of the foregoing, there is a need in the art for a way to address the problems of the related art.

SUMMARY OF INVENTION

The invention includes a polishing inhibiting layer forming additive for a slurry, the slurry so formed, and a method of chemical mechanical polishing. The polishing inhibiting layer is formed through application of the slurry to the surface being polished and is removable at a critical polishing pressure ($P_{crit}$). The polishing inhibiting layer allows recessed or low pattern density locations to be protected until a critical polishing pressure is exceeded based on geometric and planarity considerations, rather than slurry or polishing pad considerations. The invention recognizes that with such a layer forming additive, polishing rate is non-linear relative to polishing pressure in a recessed or less pattern dense location, and implements the polishing inhibiting layer to alter the polishing rate-pressure relationship. In one embodiment, the additive has a chemical structure: $[CH_3(CH_2)_xN(R)]M$, wherein M is selected from the group consisting of: Cl, Br and I, x equals an integer between 2 and 24, and the R includes three carbon-based functional groups, each having less than eight carbon atoms.

A first aspect of the invention is directed to a method for polishing a wafer, the method comprising the steps of: providing a semiconductor wafer having a topography including a first topography location and a different second topography location; applying a slurry that includes an additive for forming a polishing inhibiting layer in situ across the topography, the polishing inhibiting layer creating a polishing rate for the topography that is non-linear with polishing pressure; and chemical mechanical polishing the topography.

A second aspect of the invention is directed to a wafer polishing slurry, comprising: a plurality of polishing particles; a solvent in which the polishing particles are suspended; and a polishing inhibiting layer forming additive for forming a layer on a surface of a wafer in situ to inhibit a polishing rate thereof, the polishing inhibiting layer creating a polishing rate for the topography that is non-linear with polishing pressure.

A third aspect of the invention is directed to a polishing inhibiting layer forming additive for a chemical mechanical polishing slurry, the additive comprising: a surfactant having a chemical structure selected from the group consisting of: a) [CH$_3$(CH$_2$)$_x$N(R)]M, wherein M is selected from the group consisting of: Cl, Br and I, x equals an integer between 2 and 24, and the R includes three carbon-based functional groups, each having less than eight carbon atoms; and b) C$_p$H$_q$QN, where Q is selected from the group consisting of: Cl, Br and I, and p>8 and q>20, wherein the surfactant forms a polishing inhibiting layer creating a polishing rate that is non-linear with polishing pressure.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein:

FIGS. 4G-4I show graphical representations of the non-linear rate versus pressure CMP process of FIGS. 4A-F for comparison with FIGS. 2G-2H.

FIG. 5 shows a graphical representation of polishing rate versus concentration of one embodiment of a polishing inhibiting layer forming additive according to the invention.

FIG. 6 shows a graphical representation of polishing rate versus polishing pressure of another embodiment of a polishing inhibiting layer forming additive according to the invention.

FIG. 7A shows a case for conditions under which a cationic surfactant is needed.

FIG. 7B shows a case for conditions under which an anionic surfactant is needed.

DETAILED DESCRIPTION

Figure 1:
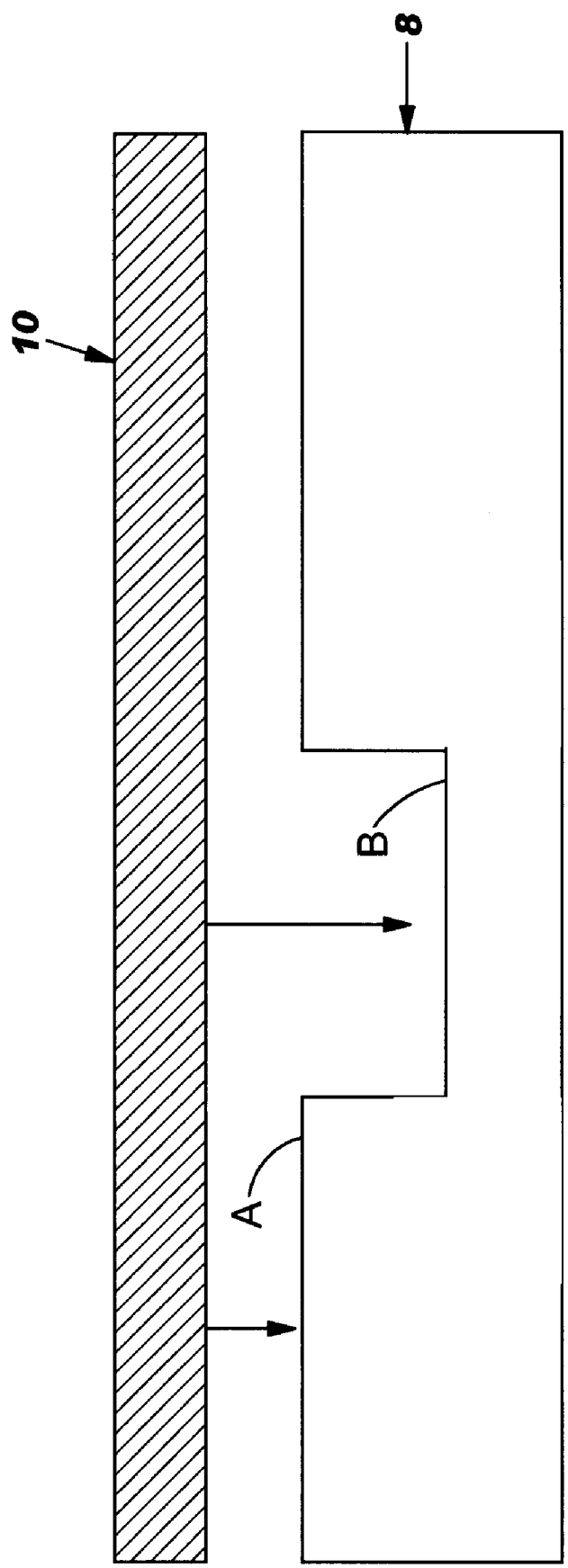
FIG. 1 shows a conventional chemical mechanical polishing (CMP) environment.
Figure 2B:
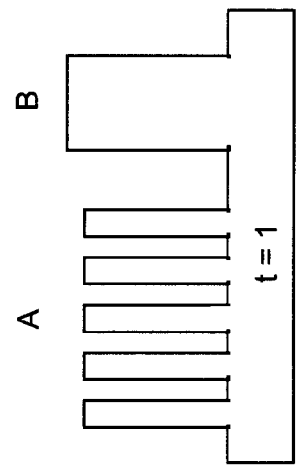
FIGS. 2A-2H show schematic and graphical representations of a conventional CMP process on a particular wafer topology.
Figure 2D:
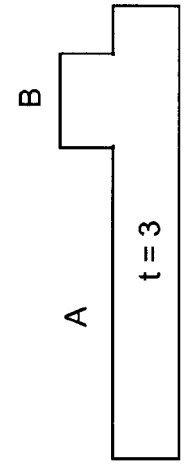
Figure 2F:
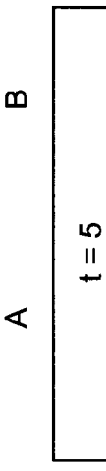
Figure 2A:
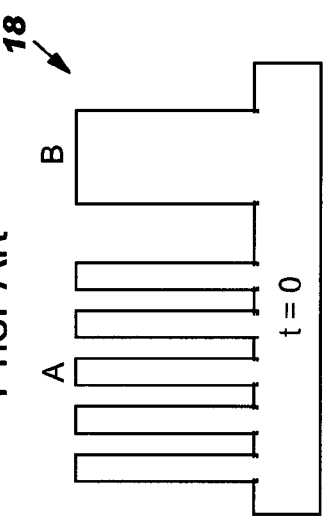
Figure 2C:
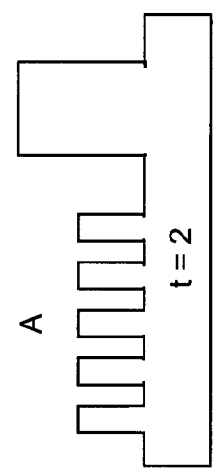
Figure 2E:
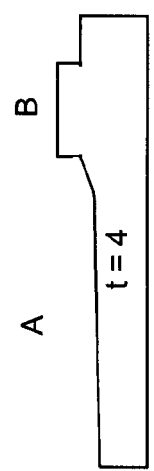
Figure 2G:
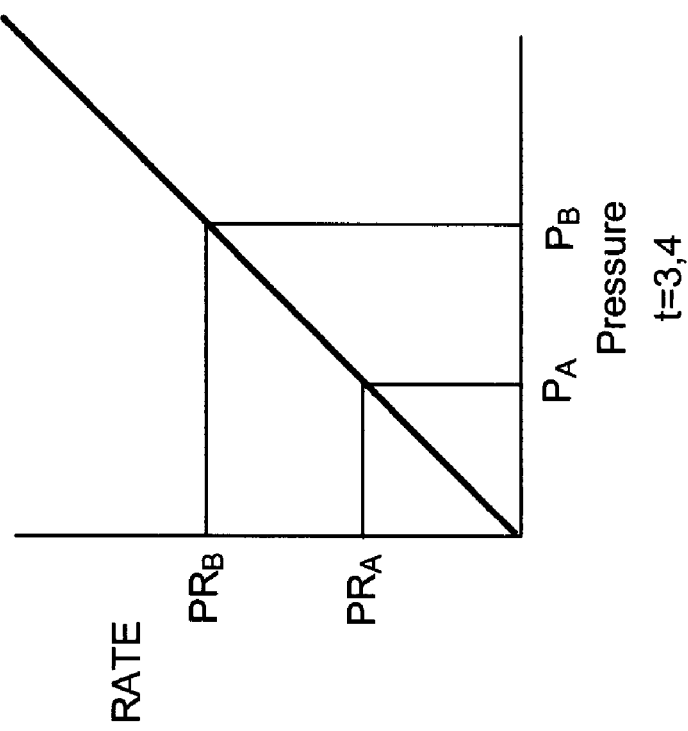
Figure 2H:
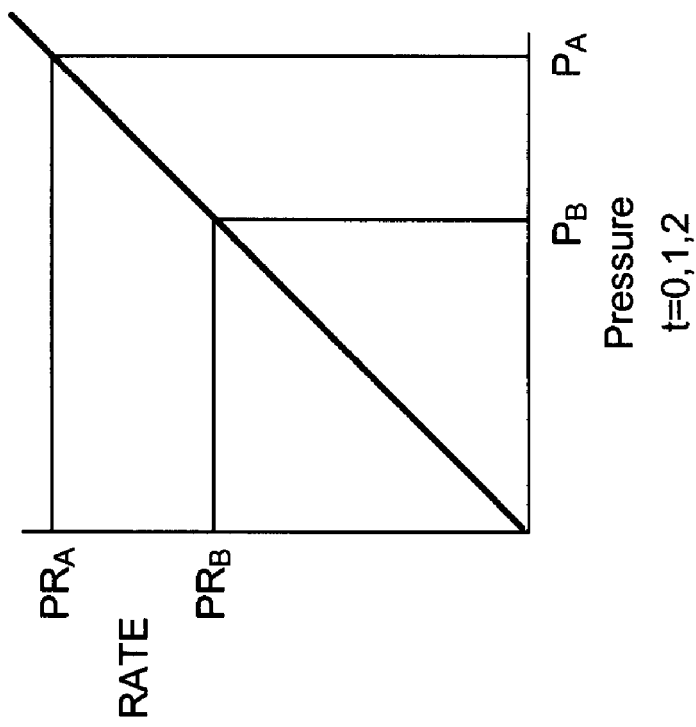
Figure 3:
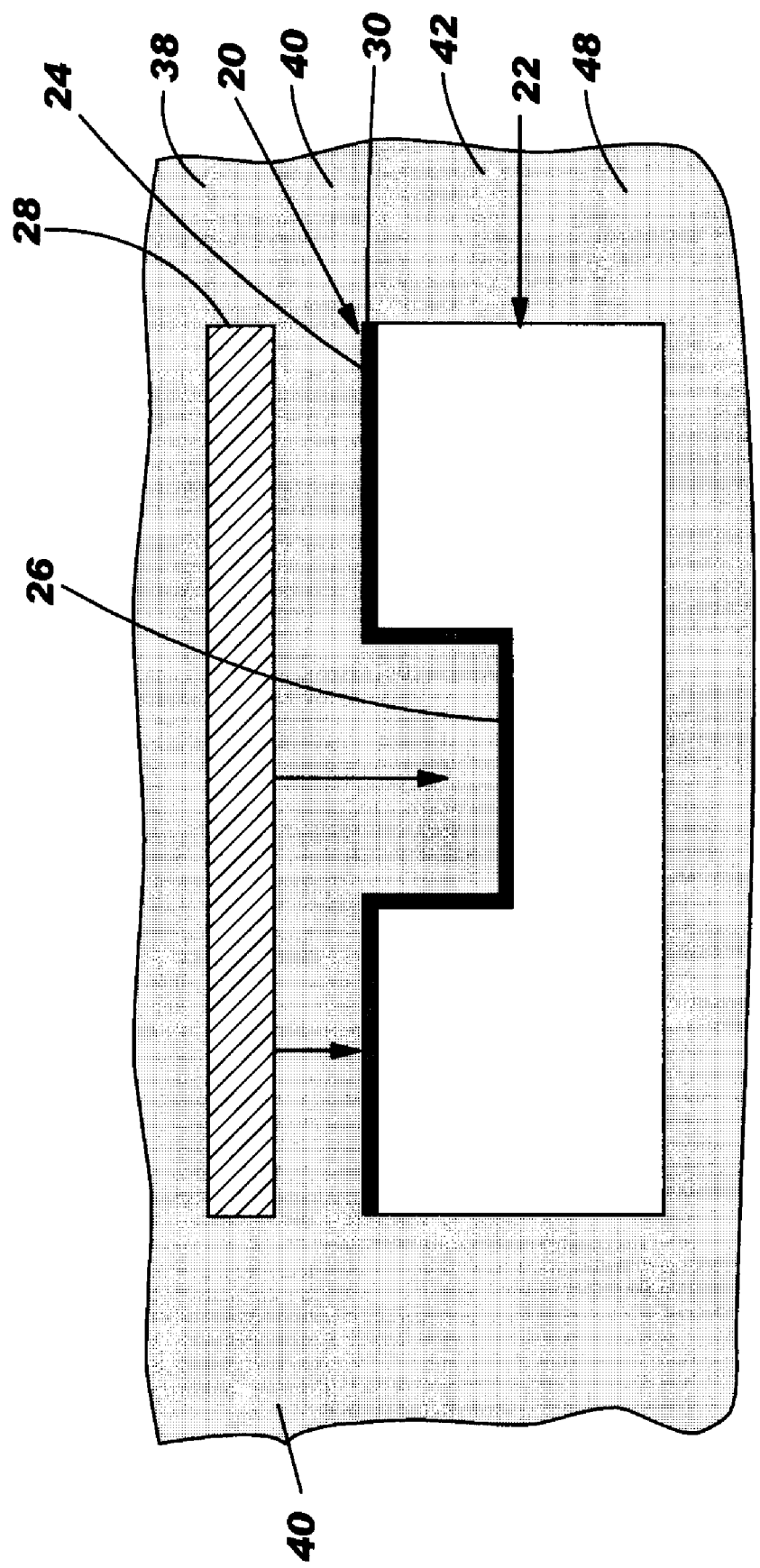
FIG. 3 shows a CMP environment according to the invention including a polishing inhibiting layer.
Figure 4A:
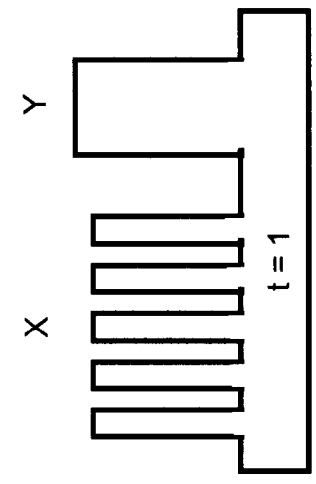
FIGS. 4A-4F show schematic representations of a CMP process according to the invention on the wafer topology of FIGS. 2A-F.
Figure 4B:
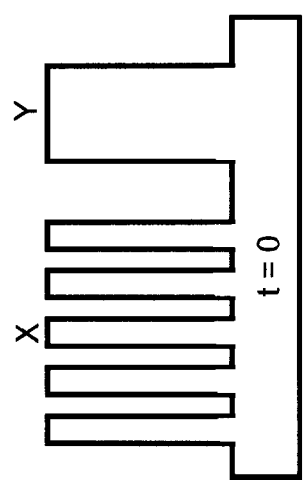
Figure 4C:
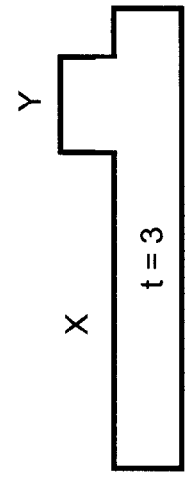
Figure 4D:
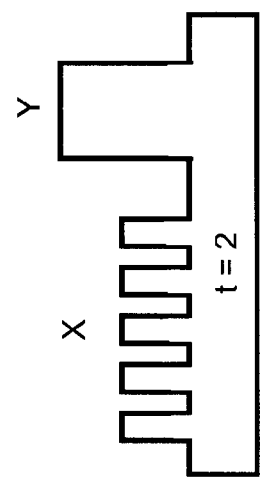
Figure 4E:
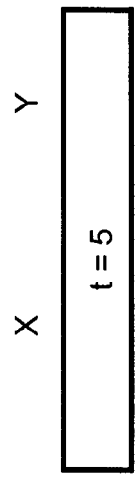
Figure 4F:
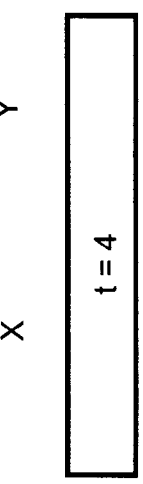

With reference to the accompanying drawings, FIG. 3 illustrates an illustrative surface topography 20 of a semiconductor wafer 22 including a first topography location 24 and a different second topography location 26. For purposes of description, a difference between topography locations 24, 26 is illustrated in the form of a height difference including a raised location 24 and a recessed location 26, or as a different density in patterns as illustrated in FIGS. 4A-4F. It should be recognized, however, that a difference or differences between topographies may exist in any now known or later developed structural or chemical differences.

According to a method of the invention, the above-described wafer 22 is provided for chemical mechanical polishing by a polishing pad 28. In order to provide a more planar end result, a polishing inhibiting layer 30 is applied across topography 20. In one embodiment, layer 30 is provided via a wafer polishing slurry 38 that is applied in a conventional fashion. Slurry 38 includes a plurality of polishing particles 40 and a solvent 42 in which polishing particles 40 are suspended. In addition, slurry 38 includes a polishing inhibiting layer forming additive 42 including a surfactant for forming layer 30 on surface topography 20 of wafer 22 in situ. The surfactant can be anionic or cationic depending on surface topography 20 to be polished and polished particle 40 used. Polishing particles 40 may include at least one of ceria, silica and alumina, or other conventional polishing particles. Chemical mechanical polishing of topography 20 occurs in any now known or later developed fashion, e.g., rotation of polishing pad 28 or polishing wafer.

As noted above, additive 42 includes either an anionic surfactant or a cationic surfactant depending on composition of the surface topology 20 and the polishing particle 40. In one embodiment, additive 42 may have the chemical structure: [CH$_3$(CH$_2$)$_x$N(R)]M, wherein M is selected from the group consisting of: Cl, Br and I, the R includes three carbon-based functional group having less than eight carbon atoms and x equals an integer between 2 and 24. In one embodiment, the carbon-based functional group may be selected from the group consisting of: CH$_3$, CH$_2$OH, C$_2$H$_4$OH, C$_2$H$_5$, C$_3$H$_6$OH and C$_3$H$_7$, where each has at least eight carbon atoms. However, other carbon-based functional groups are possible. Particular cationic surfactant examples include: cetyltrimethyl ammonium bromide (CTAB) [CH$_3$(CH$_2$)$_{15}$N(CH$_3$)$_3$]Br; cetyldimethylethyl ammonium bromide (CDB) [CH$_3$(CH$_2$)$_{15}$N(CH$_3$)$_2$CH$_2$OH]Br; [CH$_3$(CH$_2$)$_x$N(CH$_3$)$_3$]Br, where x is between 2 and 24; and [CH$_3$(CH$_2$)$_x$N(CH$_3$)(C$_2$H$_5$)(C$_3$H$_7$)]Br, where x is between 2 and 24. In another embodiment, additive 42 may have the chemical structure: C$_p$H$_q$QN, where Q is selected from the group consisting of: Cl, Br and I, and p>8 and q>20. In one particular example of this embodiment, additive 42 includes C$_p$H$_q$QN, and Q is Cl, p=21, and q=38, resulting in cetylpyridinium chloride (C$_{21}$H$_{38}$ClN). In terms of an anionic surfactant, additive 42 may include at least one of: sodium sulfate, sodium dodecyl sulfate, sodium lauryl sulfate, sodium stearate and sodium tetradecyl sulfate.

Additive 42 is attracted to surface topology 20 so as to form a layer 30 thereon, and can only be removed by application of a polishing pressure greater than a critical removal polishing pressure P$_{crit}$ of layer 30. Additive 42, by virtue of being in the applied slurry is dynamically removed through the application of the polishing process when the localized pressure is above critical removal polishing pressure P$_{crit}$ of layer 30. The result is that for locations in excess of the critical removal polishing pressure P$_{crit}$, a dynamic environment is achieved where polishing occurs in which layer 30 is formed, then mechanically removed, and the process repeated. In one embodiment, critical removal polishing pressure P$_{crit}$ for layer 30 formed by one of the above species is no less than approximately 2 pounds per square inch (psi) and no greater than approximately 20 psi. However, another P$_{crit}$ may be employed depending on circumstances. In one embodiment, the polishing includes applying a downforce of no more than approximately 4 psi above the critical removal polishing pressure P$_{crit}$, and no less than approximately 4 psi below the critical removing polishing pressure P$_{crit}$.

Turning to FIGS. 4A-4F and 4G-4I, features of implementation of polishing inhibiting layer 30 will now be described. FIGS. 4A-4F show schematic representations of a chemical mechanical polishing (CMP) process according to the invention on the wafer topology of FIGS. 2A-F. Location X and location Y have different topologies in the form of different pattern densities, i.e., location X has less pattern density than location Y. As a result, from time=0-2 (FIGS. 4A-4C), localized polishing pressure at location X (P$_X$) and location Y (P$_Y$) are different, which leads to different polishing rates PR$_X$ and PR$_Y$ that are greater than zero (0). This time period is graphically illustrated in FIG. 4G. Both locations, however, have a polishing pressure P$_X$ and P$_Y$ greater than a critical removal polishing pressure $P_{crit}$ of layer 30. As a result, as polishing proceeds, layer 30 is removed by polishing at a pressure higher than the critical removal polishing pressure $P_{crit}$.

As polishing proceeds through time=3, 4 (FIGS. 4D-4E), topography is polished away in low density location X, but layer 30 begins inhibiting polishing at location X because the polishing pressure $P_X$ decreases below critical removal polishing pressure $P_{crit}$ of layer 30. This time period is illustrated graphically in FIG. 4H. Due to the higher local polishing pressure $P_Y$ at location Y (i.e., because of the denser pattern), however, polishing continues to occur in this location. During this period, $P_X<P_{crit}$ and $PR_X=0$, and $P_Y>P_{crit}$ and $PR_Y>0$. In this sense, layer 30 has decreased a polishing rate PR of one of the topography locations, e.g., X, to a level defined according to: $PR=k*(P-P_{crit})$, where PR is the polishing rate, k is a coefficient of friction of the slurry, P is a polishing pad polishing pressure at one of the topography locations (i.e., location X), and $P_{crit}$ is the critical removal polishing pressure to be applied for removal of layer 30.

At time=5 (FIG. 4E-4F), planarity is achieved, and polishing stops. In this case, $P_X<P_{crit}$ and $PR_X=0$, and $P_Y<P_{crit}$ and $PR_Y=0$. This time is illustrated graphically in FIG. 4I.

Turning to FIG. 5, a graphical representation of polishing rate (Å/min) versus concentration (g/L) of additive 42 (FIG. 3) in the form of cetyltrimethyl ammonium bromide (CTAB) on an illustrative surface of silicon dioxide ($SiO_2$) is shown. In this example, the data was taken with the following slurry conditions: slurry composition 1.6 w % cerium oxide, pH=5, and the following tool parameters: 6 psi of downforce (applied pressure), rotation rates of 25/50 rpm for wafer and table, respectively, and slurry flow rate of 120 ml/min. FIG. 5 illustrates how the concentration of additive 42 (FIG. 3) can be controlled to control polishing rate. As shown in the graph, at low (or no) concentrations of additive 42 (FIG. 3), the polishing rate is high, which indicates that no layer 30 (FIG. 3) is formed. However, with the addition of additive, the polishing rate decreases rapidly, which indicates formation of layer 30 (FIG. 3) on the oxide surface. With the addition of greater than 0.2 g/L CTAB, the polishing rate becomes deminimus.

Turning to FIG. 6, polishing rate (Å/min) versus polishing pressure/downforce (psi) on an illustrative surface of silicon oxide ($SiO_2$) is illustrated in graphical form. FIG. 6 provides a more detailed rendition of the graphs of FIGS. 4G-4I. In this embodiment, the slurry includes 0.8 w % ceria, at a fixed concentration of 0.12 g/L cetyldimethylethyl ammonium bromide (CDB), with a 25/50 rotation of the pad at a slurry rate of 120 ml/min. FIG. 6 illustrates that layer 30 (FIG. 3) can be formed where polishing rate is non-linear with polishing pressure by using additive 42 (FIG. 3). At low polishing pressure, the polishing rate is zero. However, as pressure increases beyond critical removal polishing pressure $P_{crit}$ of layer 30, e.g., about 3 psi, the polishing rate is non-zero and increases with increased pressure.

According to the invention, in the case that the pH level of the slurry is greater than the isoelectric point (IEP) of the surface and less than the isoelectric point of the polishing particles, i.e., IEP(surface)<pH slurry<IEP (particles), a cationic surfactant (that with a positive charge) is added. (An "isoelectric point" refers to the pH level at which the surface charge of a material is neutrally charged.) In contrast, in the case that the pH level of the slurry is less than the isoelectric point of the surface and greater than the isoelectric point of the polishing particles, i.e., IEP (particles)<pH slurry<IEP (surface), an anionic surfactant (that with a negative charge) is added. Referring to FIG. 3, an additional step of the method of the present invention may include controlling a pH level of slurry 38 to be between an isoelectric point of the topography and an isoelectric point of polishing particles 40 to ensure adhesion of polishing inhibiting layer 30 to surface topography 20, and to prevent adhesion of polishing inhibiting layer to the polishing particle, which may also be an inorganic material. This step includes adding a material 48 to slurry 38 to attain this balance. In one embodiment, material 48 may include an acid and/or a base depending on the isoelectric points of surface topography 20 and the polishing particles. In one embodiment, an acid is selected from the group consisting of: nitric acid, hydrochloric acid, phosphoric acid and sulfuric acid, and a base is selected from the group consisting of: potassium hydroxide and sodium hydroxide. However, other similar-acting materials and chemicals may be used to adjust the pH level, as might be selected by those skilled in the art.

Referring to FIG. 7A, a graphical representation of an example implementation of the invention is illustrated in which a cationic surfactant is required, i.e., IEP(surface)<pH slurry<IEP (particles). In FIG. 7A, a pH band 50 indicates the relative pH of a polished surface 52 and a polishing particle 54, and also indicates the particular pH of the slurry to which a polished surface 52 is exposed. In this example, polished surface 50 includes silicon dioxide ($SiO_2$), which has an isoelectric point of approximately 2. That is, polished surface 50 has a positive charge below a pH of approximately 2 and a negative charge thereabove. A polishing particle in the form of, for example, ceria has an isoelectric point of approximately 7, which has a positive charge below a pH of approximately 7 and a negative charge thereabove. In this situation, a cationic surfactant such as CTAB is added to the slurry to form layer 30. In addition, in order to achieve polishing inhibiting layer 30 on the surface to be polished, one or more of the acids and bases listed above may be added to maintain the pH level of slurry 38 (FIG. 3) to be between an isoelectric point of polished surface 52 (i.e., ~2) and an isoelectric point of polishing particle 54 (i.e., ~7). Cationic surfactant is attracted towards the surface 52 to be polished and will adhere to that surface due to electrostatic effects. However, note that the cationic surfactant will not be attracted to polishing particle 54, which would have the same positive charge.

Referring to FIG. 7B, the situation in which the pH level of the slurry is less than the isoelectric point of the surface 152 and greater than the isoelectric point of the polishing particles 154, i.e., IEP (particles)<pH slurry<IEP(surface), is graphically represented. In this case, an anionic surfactant (that with a negative charge) is added to form polishing inhibiting layer 30. In FIG. 7B, a pH band 150 indicates the relative pH of a polished surface 152 and a polishing particle 154, and also indicates the particular pH of the slurry to which a polished surface 152 is exposed. In this example, polished surface 150 includes silicon nitride (SiN), which has an isoelectric point of approximately 9. That is, polished surface 150 has a positive charge below a pH of approximately 9 and a negative charge thereabove. A polishing particle 152 in the form of, for example, silica has an isoelectric point of approximately 3, which has a positive charge below a pH of approximately 3 and a negative charge thereabove. In this situation, an anionic surfactant is added to form polishing inhibiting layer 30. In FIG. 7B, the anionic material includes sodium dodecylsulfate, although other anionic materials are possible. In addition, to maintain the pH level of slurry 38 (FIG. 3) to be between an isoelectric point of polished surface 152 (i.e., ~3) and an isoelectric point of polishing particle 154 (i.e., ~9), one or more of the acids and bases listed above may also be added. In this situation, the anionic surfactant will be attracted towards the surface 152 to be polished and will adhere to that surface due to electrostatic effects. However, note that the anionic surfactant will not be attracted to polishing particle 154, which would have the same negative charge.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

The invention claimed is:

1. A method for polishing a wafer, the method comprising the steps of:
    providing a semiconductor wafer having a topography including a first topography location and a different second topography location;
    applying a slurry that includes an additive for forming a polishing inhibiting layer in situ across the topography, wherein the additive and a surface of the topography have opposite electrostatic charges to ensure adhesion of the polishing inhibiting layer to the surface of the topography, the polishing inhibiting layer creating a polishing rate for the topography that is non-linear with polishing pressure; wherein the additive includes one of: an anionic surfactant and a cationic surfactant and wherein the cationic surfactant includes a chemical structure selected from the group consisting of:
        a) $[CH_3(CH_2)_xN(R)]M$, wherein M is selected from the group consisting of: Cl, Br and I, x equals an integer between 2 and 24, and the R includes three carbon-based functional groups, each having less than eight carbon atoms; and
        b) $C_pH_qQN$, where Q is selected from the group consisting of: Cl, Br and I, and p>8 and q>20; and;
    chemical mechanical polishing the topography.

2. The method of claim 1, wherein the carbon-based functional groups are selected from the group consisting of: $CH_3$, $CH_2OH$, $C_2H_4OH$, $C_2H_5$, $C_3H_6OH$ and $C_3H_7$.

3. The method of claim 1, wherein the cationic surfactant includes $C_pH_qQN$, and Q is Cl, p=21, and q=38, resulting in cetylpyridinium chloride ($C_{21}H_{38}ClN$).

4. The method of claim 1, wherein the cationic surfactant includes one of: cetyltrimethyl ammonium bromide (CTAB), $[CH_3(CH_2)_{15}N(CH_3)_3]Br$; cetyldimethylethyl ammonium bromide (CDB), $[CH_3(CH_2)_{15}N(CH_3)_2CH_2OH]Br$; $[CH_3(CH_2)_xN(CH_3)_3]Br$, where x equals an integer between 2 and 24; and $[CH_3(CH_2)_xN(CH_3)(C_2H_5)(C_3H_7)]Br$, where x equals an integer between 2 and 24.

5. The method of claim 1, wherein the anionic surfactant includes at least one of: sodium sulfate, sodium dodecyl sulfate, sodium lauryl sulfate, sodium stearate and sodium tetradecyl sulfate.

6. The method of claim 1, wherein the polishing inhibiting layer decreases a polishing rate of one of the topography locations to a level defined according to: $PR=k*(P-P_{crit})$, where PR is the polishing rate, k is a coefficient of friction of a slurry, P is a polishing pad polishing pressure at one of the topography locations, and $P_{crit}$ is a critical removal polishing pressure to be applied for removal of the polishing inhibiting layer.

7. The method of claim 6, further comprising the step of removing the polishing inhibiting layer by polishing at a pressure greater than the critical removal polishing pressure.

8. The method of claim 6, wherein the critical removal polishing pressure $P_{crit}$ is no less than approximately 2 psi and no greater than approximately 20 psi.

9. The method of claim 6, wherein the polishing step includes applying a downforce of no more than 4 psi above the critical removal polishing pressure $P_{crit}$, and no less than 4 psi below the critical removing polishing pressure $P_{crit}$.

10. The method of claim 1, further comprising the step of controlling a pH level of the slurry to be between an isoelectric point of the topography and an isoelectric point of a polishing particle of the slurry to ensure adhesion of the polishing inhibiting layer to the surface of the topography, wherein the controlling step includes adding at least one of an acid and a base.

11. The method of claim 10, wherein the acid is selected from the group consisting of: nitric acid, hydrochloric acid, phosphoric acid and sulfuric acid, and the base selected from the group consisting of: potassium hydroxide and sodium hydroxide.

12. The method of claim 1, wherein the difference in topography between the first topography location and the second topography location is at least one of: height and pattern density.

13. The method of claim 1, wherein the topography includes silicon dioxide, the slurry includes a polishing particle including ceria, the additive includes cetyltrimethyl ammonium bromide (CTAB) $[CH_3(CH_2)_{15}N(CH_3)_3]Br$, and a pH level of the slurry is no less than approximately 2 and no more than approximately 7.

14. The method of claim 1, wherein the topography includes silicon nitride, the slurry includes a polishing particle including silica, the additive includes sodium dodecylsulfate, and a pH level of the slurry is no less than approximately 3 and no more than approximately 9.

* * * * *